US005500622A

United States Patent [19]

Muramatsu

[11] Patent Number: 5,500,622

[45] Date of Patent: Mar. 19, 1996

[54] AUDIO SIGNAL PROCESSING CIRCUIT

[75] Inventor: Yasuhiro Muramatsu, Saitama, Japan

[73] Assignee: Kabushiki Kaisha Toshiba, Kawasaki, Japan

[21] Appl. No.: 286,741

[22] Filed: Jul. 26, 1994

[30] Foreign Application Priority Data

Jul. 27, 1993 [JP] Japan .................................... 5-184623

[51] Int. Cl.$^6$ ...................................................... H03F 1/134

[52] U.S. Cl. ............................................ 330/107; 381/119

[58] Field of Search .............................. 330/69, 107, 109, 330/124 R; 381/119, 120, 121

[56] References Cited

U.S. PATENT DOCUMENTS 4,002,994 1/1977 Fender .................................... 330/107
5,168,180 12/1992 Bayer et al. ............................ 307/520

FOREIGN PATENT DOCUMENTS 287057 10/1988 European Pat. Off. .
546619 6/1993 European Pat. Off. .
382300 4/1991 Japan .

*Primary Examiner*—Steven Mottola
*Attorney, Agent, or Firm*—Cushman Darby & Cushman

[57] ABSTRACT

An audio signal processing circuit includes an amplifier having a non-inverted input terminal, an inverted input terminal and an output terminal with an RC active filter connected across the output terminal and the inverted input terminal, means for supplying first and second audio signals to the inverted input terminal of the amplifier through a first input resistor of which one end is connected to the first audio signal input terminal and a second input resistor of which one end is connected to the second audio signal input terminal, respectively, and a grounding resistor connected between the connection node of the first and the second input resistors and a reference potential source.

2 Claims, 2 Drawing Sheets

FIG. 1 (Prior Art)
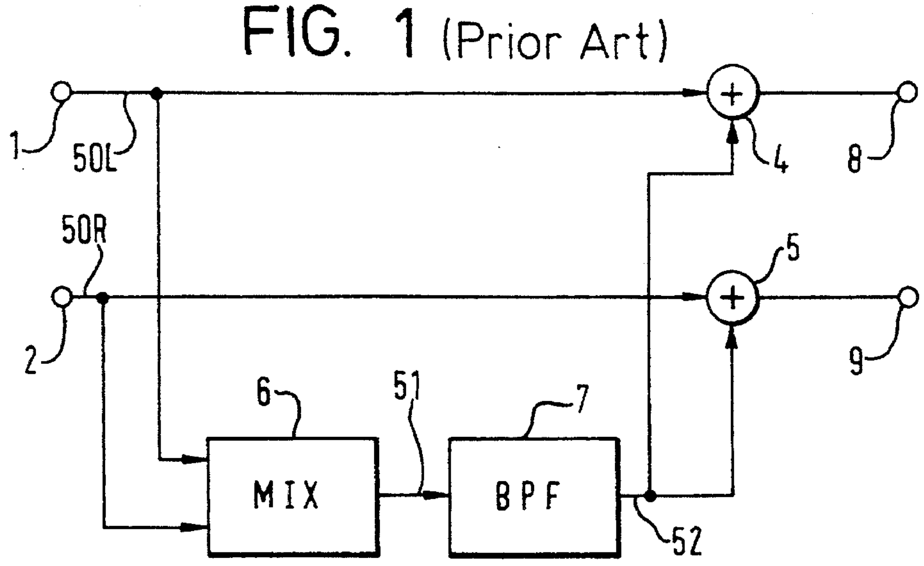
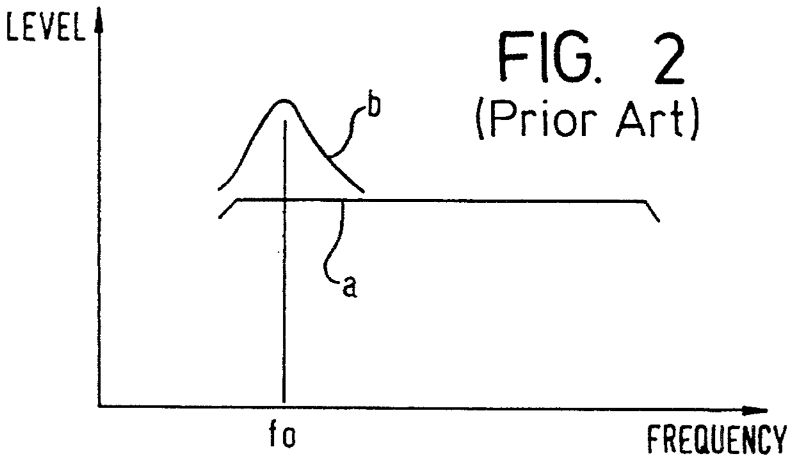
FIG. 2 (Prior Art)
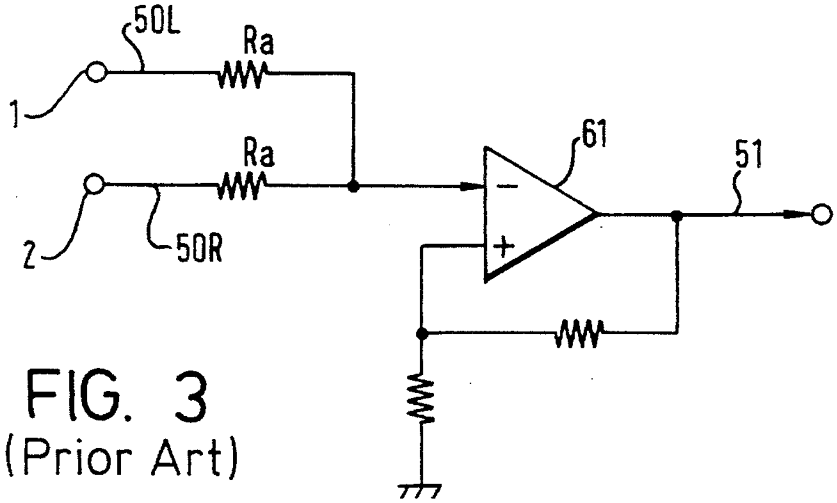
FIG. 3 (Prior Art)

AUDIO SIGNAL PROCESSING CIRCUIT

FIELD OF THE INVENTION

The present invention generally relates to an audio signal processing circuit, and more particularly, to a low frequency audio signal intensifying circuit.

BACKGROUND OF THE INVENTION

Conventionally, it is desired to intensify a prescribed low frequency sound signals in TV receivers, stereo sets, etc., to enjoy a powerful sound. FIG. 1 shows conventional audio signal processing circuit for intensifying a prescribed low band audio signal. In the drawing, reference numeral 1 denotes an input terminal to which a left channel audio signal 50L is input. Numeral 2 denotes another input terminal to which a right channel audio signal 50R is input. These left and right channel audio signals 50L and 50R applied through the left and right channel input terminals 1 and 2 are then applied to adders 4 and 5, respectively, and also to an audio signal mixing circuit 6. This audio signal mixing circuit 6 mixes the left and right channel input audio signals 50L and 50R with each other to result a monaural audio signal 51 and leads this monaural audio signal to a band-pass filter 7. As this band-pass filter 7 admits only audio signals in the low band around the resonance frequency (Fo) of the left and the right loudspeakers (not shown) to pass through it, only a low band component 52 out of the monaural signal 51 is taken out through the band-pass filter 7 and then led to the adders 4 and 5.

Therefore, the adder 4 adds the low frequency audio signal 52 output from the band-pass filter 7 to the left channel audio signal 50L and then leads the resulted left channel audio signal to a left channel output terminal 8. Further, the adder 5 adds the low frequency audio signal 52 also output from the band-pass filter 7 to the right channel audio signal 50R and then leads the resulted right channel audio signal to a right channel output terminal 9. As a result, the left and right channel audio signals having the frequency characteristic curve b as shown in FIG. 2 is obtained from the adders 4 and 5. The low frequency audio signal 52 output from the band-pass filter 7 has the frequency characteristic curve b with its low band component around the loudspeaker's resonance frequency Fo being intensified in contrast to the frequency characteristic curve a of the input audio signals 50L and 50R, as shown in FIG. 2.

FIG. 3 shows the detail of the audio signal mixing circuit 6 shown in FIG. 1. The left and the right channel audio input signals 50L and 50R are applied to the inverted input terminal (–) of an operational amplifier 61 through input resistors Ra and Rb, respectively. Thus left and the right channel audio input signals 50L and 50R are mixed with each other to result a monaural audio signal 51 in the operational amplifier 61.

The conventional audio signal processing circuit as shown in FIG. 1 has such an advantage that a prescribed low band audio component can be intensified easily only by the left and the right channel loudspeakers without providing a third loudspeaker for low frequency audio signal. However, it has such a drawback that as the audio signal mixing circuit 6 and the band-pass filter 7 are both needed. As a result, the conventional circuits are large in size and increase in cost.

As described above, although the conventional audio signal processing circuits are capable of intensifying a prescribed low frequency audio signal in a simple construction and by using only the left and the right channel loudspeakers have such a construction in which the low frequency component of the monaural signal obtained by mixing the left and the right channel audio signals is added to the left and the right channel input audio signals. Because of the construction, such a conventional audio signal processing circuit has a drawback that an audio signal mixing circuit for obtaining a monaural signal and a band-pass filter to extract the low frequency component are needed and the circuit will become large in size and increase the cost.

SUMMARY OF THE INVENTION

It is, therefore, an object of the present invention to provide an audio signal processing circuit which is able to overcome the drawback of the conventional audio signal processing circuit.

Another object of the present invention is to provide an audio signal processing circuit which is able to intensify a prescribed low frequency band of the audio signal by using a circuit simpler in construction and inexpensive.

In order to achieve the above object an audio signal processing circuit according to a first aspect of the present invention includes an amplifier having a non-inverted input terminal, an inverted input terminal and an output terminal with an RC active filter connected across the output terminal and the inverted input terminal, means for supplying first and second audio signals to the inverted input terminal or the amplifier through a first input resistor of which one end is connected to the first audio signal input terminal and a second input resistor of which one end is connected to the second audio signal input terminal, respectively, and a grounding resistor connected between the connection node of the first and the second input resistors and a reference potential source, i.e., a ground terminal.

An audio signal processing circuit according to a second aspect of the present invention includes an amplifier having a non-inverted input terminal, an inverted input terminal and an output terminal with an RC active filter connected across the output terminal and the inverted input terminal, means for supplying first and second audio signals to the inverted input terminal of the amplifier through a first input resistor (R1L) of which one end is connected to the first audio signal input terminal and a second resistor (R1R) of which one end is connected to the second audio signal input terminal, respectively, a grounding resistor (R3) connected between the connection node of the first and the second input resistors and a reference potential source, means for supplying left channel audio signals to the first audio signal input terminal, means for supplying right channel audio signals to the second audio signal input terminal, first adding means for adding the output signals from the amplifier to the left channel audio signals, and second adding means for adding the output signals from the amplifier to the right channel audio signals.

In the audio signal processing circuit according to the first aspect of the present invention, the band-pass filter, comprising an RC active filter containing an amplifier and an RC circuit, extracts prescribed band signal component from audio signal input from a single input terminal of the amplifier and outputs it through the output of the amplifier. The input resistors are commonly connected to the inverted input terminal of the amplifier through a coupling capacitor, while the grounding resistor is coupled between the connecting node of the first and the second input resistors and the ground terminal. As a result, as both one ends of the input resistors are connected to each other, the left and the right channel audio signals that are input through the other ends of these input resistors are mixed with each other to result a monaural signal and then led to the amplifier. Moreover, because the input ends of the input resistors have low input impedances, the input impedance viewed from the left and right channel input terminals are each given by the composite resistance of the one of the input resistor and the grounding resistor. Providing the input resistors are equal to each other, the input impedances are also equal to each other and an RC active filter comprising the amplifier and the RC circuit constitutes a band-pass filter having the same characteristic. Therefore, the left and the right channel audio signals can be mixed with each other and then the band limiting operation for the mixed monaural audio signal can be obtained by a circuit simple in construction as almost the same as conventional band-pass filters.

In the audio signal processing circuit according to the second aspect of the present invention, the first adder adds the low frequency component output from the audio signal processing circuit to the left channel audio input signal. The second adder adds the same low frequency component output from the audio signal processing circuit to the right channel audio input signal. Thus, the left and the right channel audio signals intensified their low bands are obtained from the first and the second adders, respectively. As the audio signal processing circuit has a simple construction almost the same as the conventional band-pass filters, it is possible to make the circuit smaller in size and cheaper in cost.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings wherein:

FIG. 1 is a circuit diagram showing a conventional audio signal processing circuit;

FIG. 2 is a graph showing the frequency characteristic of the circuit shown in FIG. 1;

FIG. 3 is a circuit diagram showing the detail of the audio signal mixing circuit shown in FIG. 1;

DESCRIPTION OF THE PREFERRED EMBODIMENTS

Figure 4:
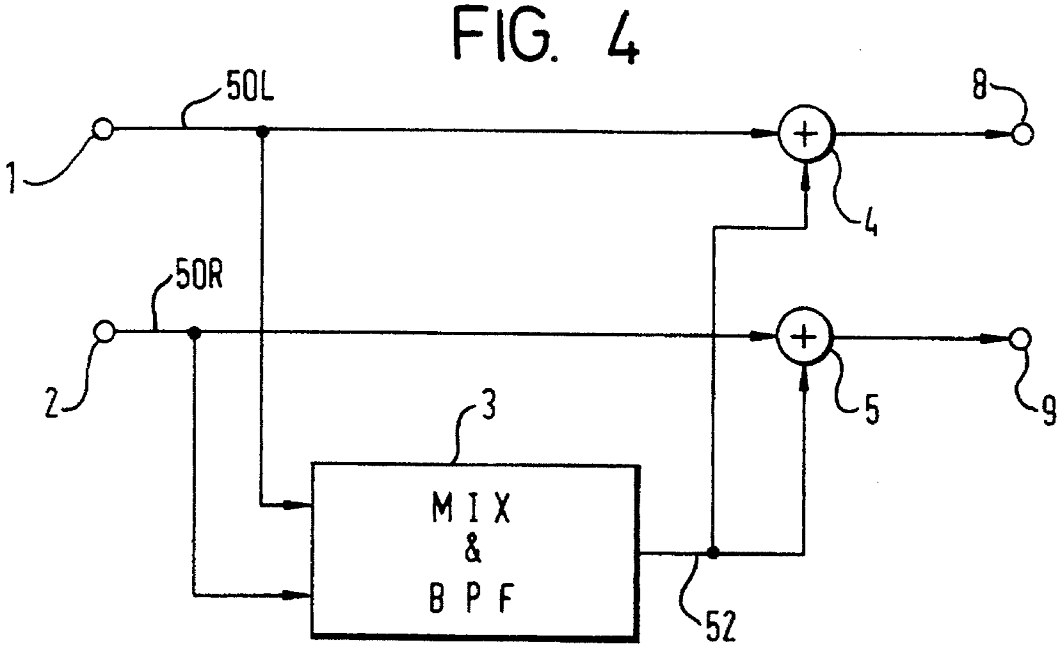
FIG. 4 is a circuit diagram showing a preferred embodiment of the audio signal processing circuit according to the present invention.

The present invention will be described in detail with reference to the FIGS. 4 and 5.

Throughout the drawings, reference numerals or letters in FIGS. 1 through 3 will be used to designate like or equivalent elements for simplicity of explanation.

Referring now to FIG. 4, a first embodiment of the audio signal processing circuit according to the present invention will be described in detail.

FIG. 4 shows the embodiment of the audio signal processing circuit for intensifying a prescribed low frequency band audio signal according to the present invention. Numeral 1 denotes an input terminal to which the left channel audio signal 50L is input. Numeral 2 denotes another input terminal to which the right channel audio signal 50R is input. Numeral 3 denotes an audio signal mixing and frequency range limiting circuit for mixing the left and the right channel audio signals 50L and 50R with each other so as to result a monaural audio signal, and for extracting the low frequency component of this monaural audio signal only to output therefrom. Numeral 4 denotes an adder for adding the low frequency component 52 to the left channel audio signal 50L. Numeral 5 denotes another adder for adding the low frequency component 52 to the right channel audio signal 50R. Numeral 5 denotes an output terminal for outputting the left channel audio signal thus intensified its low frequency component. Numeral 9 denotes another output terminal for outputting the right channel audio signal thus intensified its low frequency component.

Now the operation of the first embodiment of the audio signal processing circuit according to the present invention will be explained. The left channel audio input signal 50L on the left channel input terminal 1 is applied to the adder 4 and the audio signal processing circuit 3. The right channel audio input signal 50R is also applied to the adder 5 and the audio signal processing circuit 3. The audio signal processing circuit 3 mixes the left and the right channel audio signals 50L and 50R with each other so as to result a monaural audio signal. The audio signal processing circuit 3 further extracts the low frequency component 52 of the monaural audio signal and then supplies the low frequency component 52 to the adders 4 and 5. The adder 4 adds the low frequency component 52 to the left channel audio input signal 50L, as described above and then supplies the left channel audio signal thus intensified its low frequency component to the left channel output terminal 8. The adder 5 also adds the low frequency component 52 to the right channel audio input signal 50R, as also described above and then supplies the right channel audio signal thus intensified its low frequency component to the right channel output terminal 9. The left and the right channel audio signals intensified frequency components are output from the left and the right channel output terminals 8 and 9 so as to be subjected for amplifications by power amplifiers (not shown) and drivers of left and right channel loudspeakers (not shown).

Figure 5:
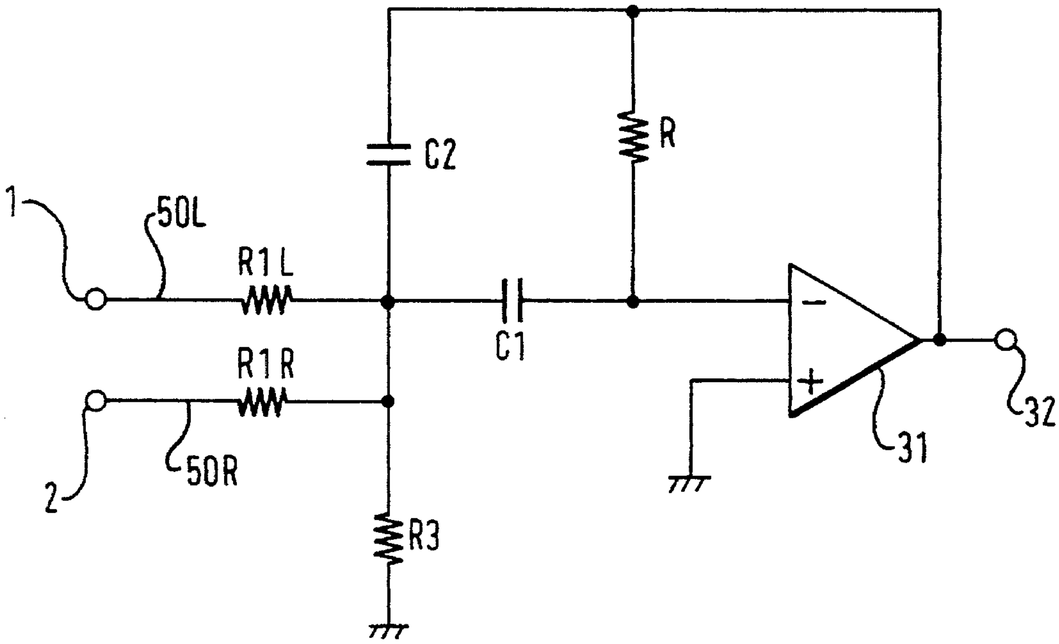
FIG. 5 is a circuit diagram showing the detail of the audio signal processing circuit of FIG. 4.

Referring now to FIG. 5, the audio signal mixing and frequency band limiting circuit 3 in FIG. 4 will be explained in detail. In this circuit 3, the input impedance of the circuit on each of the left and the right channel input terminals 1 and 2 becomes equal to the composite resistance R2 of an input resistor R1L (or R1R) and a grounding resistor R3. That is, the input impedance or the composite resistance R2 is given by an equation of $$R2=1/(1/R1+1/RS) \qquad (1)$$

In other words, the input impedance viewed from the input terminal 1 is given by the composite resistance of the parallel circuit of the input resistor R1L coupled to the input terminal 1 and the grounding resistor R3 as the input terminal 2 is at a low impedance. Also, the input impedance viewed from the input terminal 2 is given by the composite resistance of the parallel circuit of the input resistor R1R coupled to the input terminal 2 and the grounding resistor R3 as the input terminal 1 is also at a low impedance. Accordingly, the left and the right channel audio input signals 50L and 50R are mixed with each other so as to result a monaural signal and then applied to the inverted input terminal of an operational amplifier 31 via a coupling capacitor C1. This monaural signal is limited to a prescribed frequency band by the band-pass filtering function of the combination of the operational amplifier 31 and the RC circuit consisting of a filtering capacitor C2 and a filtering resistor R, and then led to the output terminal 32 from output of the operational amplifier 31. Here the resistors and capacitors are related or deficed as follows.

$$R1L=R1R=R1$$

$$R=2\times R1$$

$$C1=C2=C$$

Here, as the input impedance of the circuit 3 respectively viewed from the input terminals 1 and 2 is equally given by the composite resistance R2 as defined by the above equation (1), a center frequency $f_0$ and a bandwidth B of the band-pass filter comprised by the operational amplifier 31, the filtering capacitor C2 and the filtering resistor R are expressed as follows:

$$B=1/(2\pi R1\times C) \quad (2)$$

$$f^2_0=1/(8\pi^8 R1\times C^8)\times\{(1/R1+1/R2)\} \quad (3)$$

Accordingly, when the lower band resonance frequency $F_0$ of each of the left and the right channel loudspeakers is set almost equal to the center frequency $f_0$ of the band-pass filter, as expressed by the equation (3), an intensified low frequency audio signal component suitable to compensate an attenuation of the low frequency component of the sound generated from each of the loudspeakers can be extracted according to the circuit as shown in FIGS. 4 and 5.

According to the above embodiment of the present invention, the audio signal processing circuit 3 mixes the left and the right channel audio signals 50L and 50R as well as extracts the low frequency component 52 from the mixed monaural audio signal. In addition, as this circuit 3 has the circuit size almost the same as conventional band-pass filters which have been inevitably used. It is possible to remove such as the conventional audio signal mixing circuit 8, as shown in FIG. 3, and to make the circuit small in size and cheap in cost.

As described above, the present invention can provide an extremely preferable audio signal processing circuit. That is, the audio signal processing circuit of the present invention is able to mix the left and right channel audio signals with each other so as to result the monaural audio signal, as well as to extract a prescribed low frequency component from the monaural audio signal by the circuit simple in construction and cheaper in cost than conventional circuits.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

What is claimed is:

1. An audio signal processing circuit, comprising:

an amplifier having a non-inverted input terminal, an inverted input terminal and an output terminal;

an RC filter connecting the output terminal and the inverted input terminal;

means for supplying first and second audio signals to the inverted input terminal of the amplifier through a first input resistor of which one end is connected to a first audio signal input terminal and a second resistor of which one end is connected to a second audio signal input terminal, respectively;

a grounding resistor connected between a connection node of the first and the second input resistors and a reference potential source;

means for supplying left channel audio signals to the first audio signal input terminal;

means for supplying right channel audio signals to the second audio signal input terminal;

first adding means for adding the output signals from the amplifier to the left channel audio signals; and second adding means for adding the output signals from the amplifier to the right channel audio signals.

2. An audio signal processing circuit, comprising:

an amplifier having first and second input terminals and an output terminal;

an RC filter connected between the output terminal and the first input terminal of the amplifier;

a first input resistor having one end connected to a first audio signal input terminal;

a second input resistor having one end connected to a second audio signal input terminal;

means for supplying first and second audio signals to the first input terminal of the amplifier through the first input resistor and the second resistor;

a ground resistor connected between a connection node of the first and the second input resistors and a reference potential source;

means for supplying left channel audio signals to the first audio signal input terminal;

means for supplying right channel audio signals to the second audio signal input terminal;

first adding means for adding the output signals from the amplifier to the left channel audio signals; and second adding means for adding the output signals from the amplifier to the right channel audio signals.

* * * * *